(12) United States Patent
Yang et al.

(10) Patent No.: US 7,485,560 B2
(45) Date of Patent: Feb. 3, 2009

(54) METHOD FOR FABRICATING CRYSTALLINE SILICON THIN FILMS

(75) Inventors: Tsun-Neng Yang, Taipei (TW); Shan-Ming Lan, Dasi Township, Taoyuan County (TW)

(73) Assignee: Atomic Energy Council - Institute of Nuclear Energy Research, Taoyuan (TW)

( * ) Notice: Subject to any disclaimer, the term of this patent is extended or adjusted under 35 U.S.C. 154(b) by 244 days.

(21) Appl. No.: 11/603,043

(22) Filed: Nov. 22, 2006

(65) Prior Publication Data
US 2008/0118662 A1    May 22, 2008

(51) Int. Cl.
*H01L 21/44* (2006.01)
(52) U.S. Cl. .................. 438/607; 438/603; 438/604; 438/660; 438/758; 438/761; 257/E21.03; 257/E21.171; 257/E21.585; 257/E23.016; 257/E23.019

(58) Field of Classification Search ............ 438/603, 438/604, 607, 660, 688, 758, 761; 257/E21.03, 257/E21.171, E21.585, E23.016, E23.019, 257/E23.158
See application file for complete search history.

(56) References Cited

U.S. PATENT DOCUMENTS

| | | | |
|---|---|---|---|
| 5,179,042 A * | 1/1993 | Mikoshiba et al. .......... 438/603 |
| 5,208,187 A * | 5/1993 | Tsubouchi et al. .......... 438/607 |
| 5,302,855 A * | 4/1994 | Matsumoto et al. ......... 257/774 |
| 6,004,885 A * | 12/1999 | Hayakawa et al. .......... 438/758 |

* cited by examiner

*Primary Examiner*—Michael S Lebentritt
(74) *Attorney, Agent, or Firm*—Troxell Law Office, PLLC

(57) ABSTRACT

An amorphous silicon (Si) film is taken to form a metal silicide of Si—Al(aluminum) under a high temperature. Al atoms is diffused into the amorphous Si film for forming the metal silicide of Si—Al as nucleus site. Then through heating and annealing, a microcrystalline or nano-crystalline silicon thin film is obtained. The whole process is only one process and is done in only one reacting chamber.

20 Claims, 5 Drawing Sheets

METHOD FOR FABRICATING CRYSTALLINE SILICON THIN FILMS

FIELD OF THE INVENTION

The present invention relates to fabricating silicon (Si) thin films; more particularly, relates to growing a microcrystalline or nano-crystalline silicon thin film with a metal silicide of Si—Al (aluminum).

DESCRIPTION OF THE RELATED ARTS

A thin film having a microcrystalline structure for a silicon thin film solar cell is usually fabricated through a thin film deposition method of plasma-enhanced chemical vapor deposition (PECVD), where the thin film having a microcrystalline structure is obtained by a synthesis of hydrogen and silane with their ratio of flow or volume higher than a certain value. Yet, the silane is highly diluted with the hydrogen for crystallization so that the thin film is deposited slowly.

In the other hand, there are already two technologies using microcrystalline silicon structure thin film: thin film transistor (TFT) and liquid crystal display (LCD). They utilize an e-gun evaporation or an ion-sputtering for coating a metal thin film on a substrate with a certain thickness. An amorphous Si film is deposited on the metal thin film with a thickness slightly more than that of the metal thin film. Then, it is put into a high-temperature chamber for annealing to obtain nucleus sites for growing metal silicide and microcrystalline silicon through metal diffusing and further growing a microcrystalline silicon thin film. And then, the layer of the metal thin film and the layer of the amorphous Si film changes their positions by switching levels up and down. That is, the original lower layer of metal thin film is diffused to the top surface after a long period of time of annealing. At last the opaque material layer of the Al thin film is removed through a chemical method. But the above method required at least two process and two different reacting chamber. Hence, the prior arts do not fulfill users' requests on actual use.

SUMMARY OF THE INVENTION

The main purpose of the present invention is to transform an amorphous Si film into a microcrystalline or nano-crystalline Si thin film through a process in a reacting chamber only.

To achieve the above purpose, the present invention is a method for fabricating crystalline silicon thin films, where an amorphous Si film having a specific thickness is taken to be directly diffused with a metal silicide of Si—Al through a deposition and a diffusion of Al under an eutectic temperature of Si and Al; and then the metal silicide of Si—Al becomes a nucleus sites to further grow a microcrystalline or a nano-crystalline thin film in the following heating and annealing treatment.

BRIEF DESCRIPTIONS OF THE DRAWINGS

The present invention will be better understood from the following detailed description of the preferred embodiment according to the present invention, taken in conjunction with the accompanying drawings, in which FIG. 1 is the flow view showing the preferred embodiment according to the present invention;

DESCRIPTION OF THE PREFERRED EMBODIMENT

The following description of the preferred embodiment is provided to understand the features and the structures of the present invention.

Figure 1:
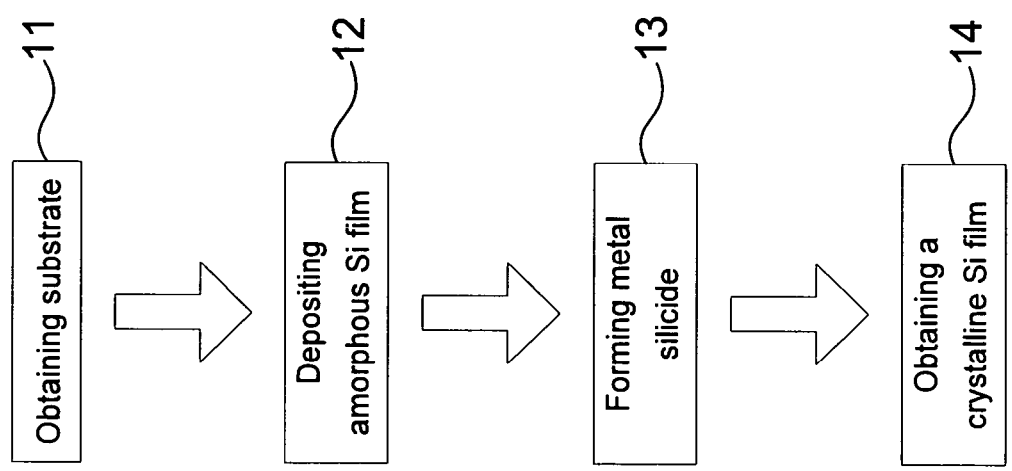
Figure 2:
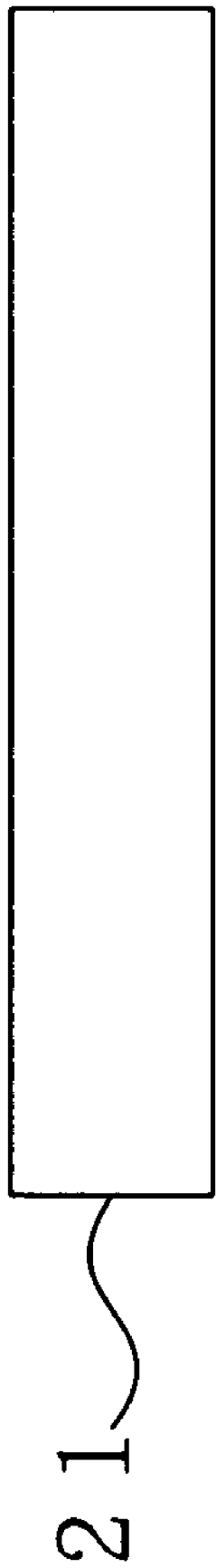
FIG. 2 is the view showing obtaining the substrate.
Figure 3:
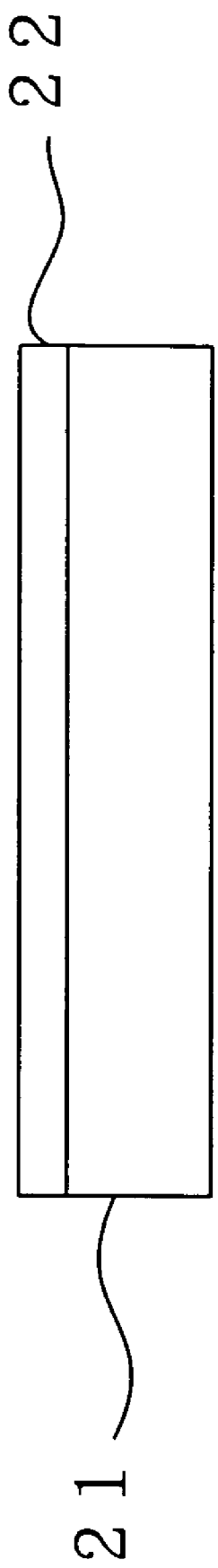
FIG. 3 is the view showing depositing the amorphous Si film.
Figure 4:
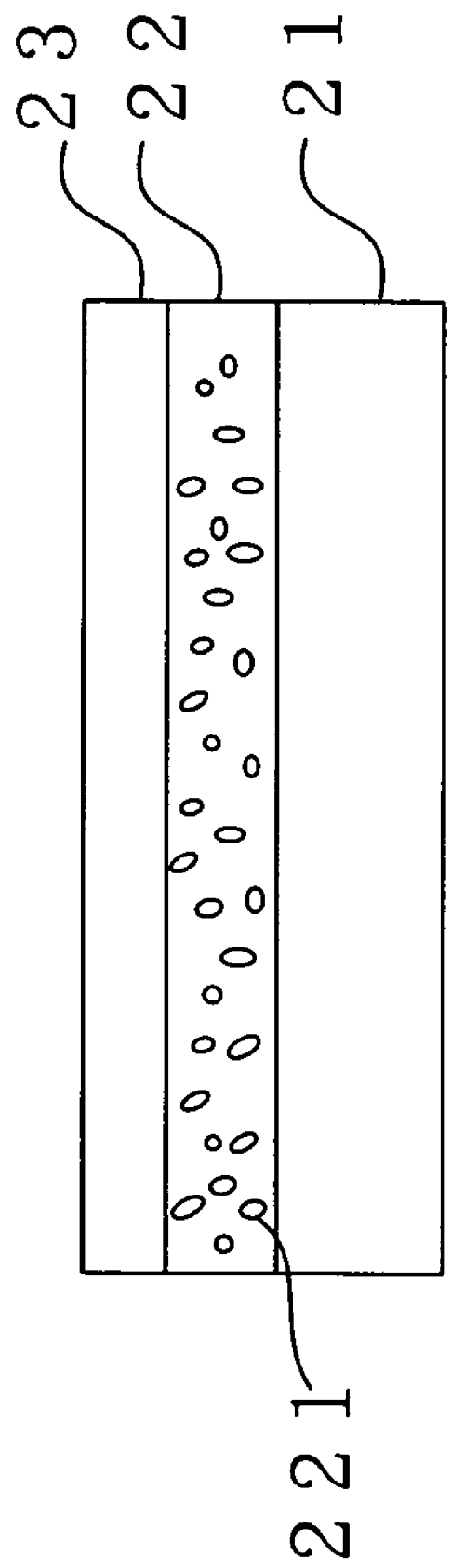
FIG. 4 is the view showing forming the metal silicide.
Figure 5:
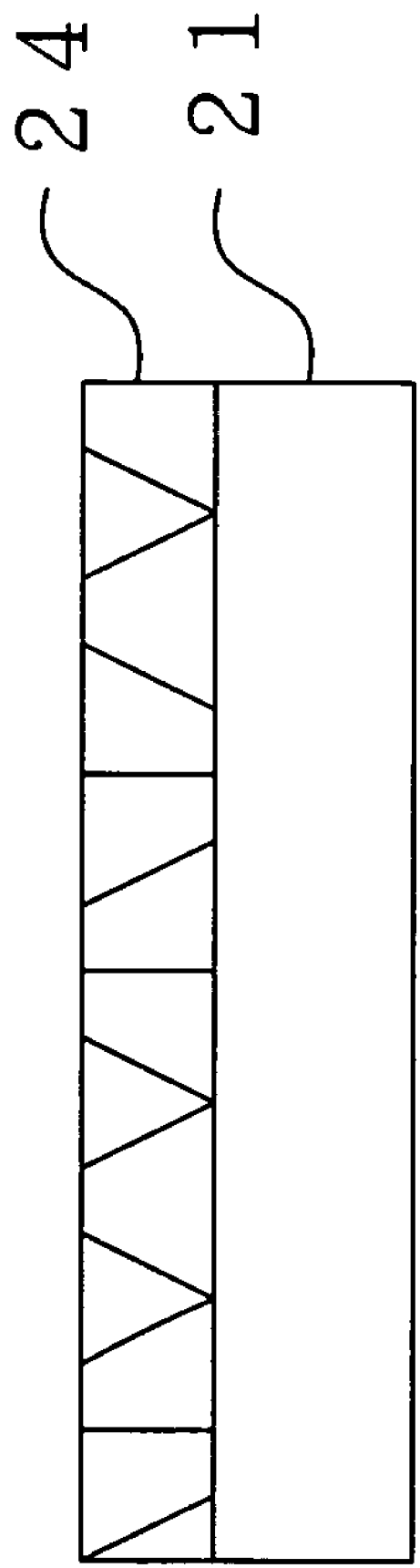
FIG. 5 is the view showing obtaining the microcrystalline or nano-crystalline silicon film.

Please refer to FIG. 1 to FIG. 5, which are a flow view showing a preferred embodiment according to the present invention; and views showing obtaining a substrate, depositing an amorphous Si (silicon) film, forming a metal silicide and obtaining a microcrystalline or nano-crystalline Si film. As shown in the figures, the present invention is a method for fabricating crystalline Si thin films, comprising the following steps:

(a) Obtaining substrate 11: A substrate 21 is obtained, made of Si, glass, sapphire ($Al_2O_3$), quartz or stainless steel, etc.

(b) Depositing amorphous Si film 12: An amorphous Si film 22 having a specific thickness is deposited on the substrate 21 through a chemical vapor deposition (CVD), where the CVD is plasma-enhanced CVD (PECVD), electron cyclotron resonance plasma-enhanced CVD (ECR-CVD) or low pressure CVD (LPCVD).

(c) Forming metal silicide 14: An environment for metalorganic CVD (MOCVD) is setup with a transfer gas of hydrogen ($H_2$) under 575 Celsius degrees (° C.), which is within an eutectic temperature of Si and Al(aluminum) between 500° C. and 575° C. And then a metal organic material of trimethylaluminum (TMA) with the $H_2$ is transferred to a reacting chamber to obtain dots of a Si—Al metal silicide as nucleus sites. When the TMA is contacted with the high-temperature surface, Al atoms is dissociated to be deposited on the surface of the amorphous Si film 22 to form a nano-layer of Al 23. Owing to the high temperature, the Al atoms are then directly diffused into the amorphous Si film 22 at the same time to form dots of metal silicide of Si—Al as nucleus sites.

(d) Obtaining a crystalline Si film 15: At last, a depositing time and a density of Al and an annealing time are controlled to obtain a microcrystalline or nano-crystalline thin film 24.

Thus, a novel method for fabricating crystalline Si thin films is obtained.

To sum up, the present invention is a method for fabricating crystalline silicon thin films, where a MOCVD method is used under an eutectic temperature of Si and Al to form dots of metal silicide of Si—Al in an amorphous silicon film having a specific thickness through depositing and diffusing; and then a microcrystalline or nano-crystalline thin film is further obtained through heating and annealing the metal silicide of Si—Al.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A method for fabricating a microcrystalline silicon (Si) thin film, comprising steps of:

(a) obtaining a substrate;

(b) depositing an amorphous Si film on said substrate through a chemical vapor deposition (CVD);

(c) setting up an environment for a metalorganic CVD (MOCVD) with a transfer gas of hydrogen ($H_2$) and with said substrate being kept under a specific temperature, and transferring a metal organic material of trimethylaluminum (TMA) with said $H_2$ to a reacting chamber to obtain dots of a Si—Al(aluminum) metal silicide to be nucleus sites; and (d) controlling a depositing time and a density of Al and an annealing time to obtain a microcrystalline Si thin film.

2. The method according to claim 1, wherein said substrate is made of Si.

3. The method according to claim 1, wherein said substrate is made of glass.

4. The method according to claim 1, wherein said substrate is made of sapphire ($Al_2O_3$).

5. The method according to claim 1, wherein said substrate is made of quartz.

6. The method according to claim 1, wherein said substrate is made of stainless steel.

7. The method according to claim 1, wherein said CVD is plasma-enhanced CVD (PECVD).

8. The method according to claim 1, wherein said CVD is electron cyclotron resonance plasma-enhanced CVD (ECR-CVD).

9. The method according to claim 1, wherein said CVD is low pressure CVD (LPCVD).

10. The method according to claim 1, wherein said specific temperature is 575 Celsius degrees (° C.) with in an eutectic temperature of Si and Al between 500° C. and 575° C.

11. A method for fabricating a nano-crystalline Si thin film, comprising steps of:

(a) obtaining a substrate;

(b) depositing an amorphous Si film on said substrate through a CVD;

(c) setting up an environment for a MOCVD with a transfer gas of $H_2$ and with said substrate being kept under a specific temperature, and transferring a metal organic material of TMA with said $H_2$ to a reacting chamber to obtain dots of a metal silicide of Si—Al to be nucleus sites; and (d) controlling a depositing time and a density of Al and annealing time to obtain a nano-crystalline Si thin film.

12. The method according to claim 11, wherein said substrate is made of Si.

13. The method according to claim 11, wherein said substrate is made of glass.

14. The method according to claim 11, wherein said substrate is made of sapphire.

15. The method according to claim 11, wherein said substrate is made of quartz.

16. The method according to claim 11, wherein said substrate is made of stainless steel.

17. The method according to claim 11, wherein said CVD is PECVD.

18. The method according to claim 11, wherein said CVD is ECR-CVD.

19. The method according to claim 11, wherein said CVD is LPCVD.

20. The method according to claim 11, wherein said specific temperature is 575 Celsius degrees (° C.) within an eutectic temperature of Si and Al between 500° C. and 575° C.

\* \* \* \* \*